(12) United States Patent
Zhao et al.

(10) Patent No.: US 8,860,143 B2
(45) Date of Patent: Oct. 14, 2014

(54) HIGH-K GATE DIELECTRIC WITH WORK FUNCTION ADJUSTMENT METAL LAYER (75) Inventors: Mei Zhao, Beijing (CN); Renrong Liang, Beijing (CN); Jing Wang, Beijing (CN); Jun Xu, Beijing (CN)

(73) Assignee: Tsinghua University (CN)

( * ) Notice: Subject to any disclaimer, the term of this patent is extended or adjusted under 35 U.S.C. 154(b) by 0 days.

(21) Appl. No.: 13/202,411

(22) PCT Filed: Aug. 2, 2011

(86) PCT No.: PCT/CN2011/077934
§ 371 (c)(1),
(2), (4) Date: Aug. 19, 2011

(87) PCT Pub. No.: WO2013/155392
PCT Pub. Date: Nov. 22, 2012

(65) Prior Publication Data
US 2012/0292711 A1 Nov. 22, 2012

(30) Foreign Application Priority Data

May 16, 2011 (CN) .......................... 2011 1 0125778
May 16, 2011 (CN) .......................... 2011 1 0126554

(51) Int. Cl.
*H01L 21/70* (2006.01)
*H01L 21/3115* (2006.01)
*H01L 21/8238* (2006.01)
*H01L 29/51* (2006.01)
*H01L 29/66* (2006.01)

(52) U.S. Cl.
CPC .. *H01L 21/823842* (2013.01); *H01L 21/31155* (2013.01); *H01L 29/517* (2013.01); *H01L 29/513* (2013.01); *H01L 29/66659* (2013.01); *H01L 29/512* (2013.01)

USPC .................................. 257/369; 257/E27.062

(58) Field of Classification Search
USPC .................. 257/310, 369, E27.062, E21.409
See application file for complete search history.

(56) References Cited

U.S. PATENT DOCUMENTS

| 6,797,572 | B1 | 9/2004 | Jeon et al. | |
|---|---|---|---|---|
| 2008/0191286 | A1 | 8/2008 | Chang et al. | |
| 2008/0308865 | A1* | 12/2008 | Wang et al. | 257/345 |
| 2012/0061773 | A1* | 3/2012 | Tsuchiya | 257/411 |

FOREIGN PATENT DOCUMENTS

| CN | 1949532 | A | 4/2007 |
|---|---|---|---|
| CN | 101221922 | A | 7/2008 |
| CN | 101656214 | A | 2/2010 |
| CN | 101661883 | A | 3/2010 |
| CN | 101800196 | A | 8/2010 |
| CN | 101930996 | A | 12/2010 |

OTHER PUBLICATIONS

International Search Report and Written Opinion for Application No. PCT/CN2011/077934 dated Mar. 8, 2012.

* cited by examiner

*Primary Examiner* — Selim Ahmed
(74) *Attorney, Agent, or Firm* — Lerner, David, Littenberg, Krumholz & Mentlik, LLP (57) ABSTRACT A semiconductor structure is provided. The semiconductor structure comprises: a substrate; a gate dielectric layer formed on the substrate; a metal gate electrode layer formed on the gate dielectric layer; and at least one metal-containing adjusting layer for adjusting a work function of the semiconductor structure, in which an interfacial layer is formed between the substrate and the gate dielectric layer, and an energy of bond between a metal atom in the metal-containing adjusting layer and an oxygen atom is larger than that between an atom of materials forming the gate dielectric layer or the interfacial layer and an oxygen atom. Further, a method for forming the semiconductor structure is also provided.

5 Claims, 12 Drawing Sheets

HIGH-K GATE DIELECTRIC WITH WORK FUNCTION ADJUSTMENT METAL LAYER

CROSS REFERENCE TO RELATED APPLICATIONS

The present application is a national phase entry under 35 USC §371 of International Application No. PCT/CN2011/077934, filed Aug. 2, 2011, which claims the benefit of and priority to Chinese Patent Application No. 201110126554.2 and 201110125778.1, both filed May 16, 2011, the entire disclosures of which are incorporated herein by reference.

FIELD

The present disclosure relates to a semiconductor manufacturing and design field, and more particularly to a semiconductor structure and a method for forming the same.

BACKGROUND

In a conventional CMOS process, in order to improve a performance of a device, high k (dielectric constant) gate dielectric materials and metal gate materials are commonly used. Researches show that high k dielectric materials instead of silicon oxide as a gate dielectric of a CMOS device have a dielectric constant higher than that of silicon oxide, so that a gate capacitance may be increased without decreasing a physical thickness of the CMOS device. Therefore, an equivalent oxide thickness (EOT) may be decreased without increasing leakage, thus improving the performance of the device.

However, some problems need to be improved in a process of using high k gate dielectric materials and metal gate materials. For example, an interface state is high, the EOT needs to be further decreased, and a work function needs to be adjusted. However, a dielectric constant of an interfacial layer formed during annealing is low, and a thickness of the interfacial layer is about 1 nm, thus preventing the EOT from being further decreased and preventing the performance of the device from being further improved. As for the work function, a use of TiN/HfO$_2$ may meet a requirement of PMOS (the work function being about 5.2 eV). However, there is no suitable technology for adjusting the work function of the semiconductor structure without introducing a capping layer to meet a requirement of NMOS (the work function being about 4.2 eV). In addition, a thermal stability of high k dielectrics is always a focus. Hafnium based gate dielectric has become a useful dielectric material. However, hafnium oxide may be easily crystallized at about 500° C., thus increasing a device leakage and deteriorating the performance of the device.

SUMMARY

The present disclosure is aimed to solve at least one of the above mentioned technical problems.

According to an aspect of the present disclosure, a semiconductor structure is provided, comprising: a substrate; a gate dielectric layer formed on the substrate; a metal gate electrode layer formed on the gate dielectric layer; and at least one metal-containing adjusting layer for adjusting a work function of the semiconductor structure, in which an interfacial layer is formed between the substrate and the gate dielectric layer, and an energy of bond between a metal atom in the metal-containing adjusting layer and an oxygen atom is larger than that between an atom in the gate dielectric layer or in the interfacial layer and an oxygen atom.

In one embodiment, the metal-containing adjusting layer is formed in a lower part of the metal gate electrode layer; the metal-containing adjusting layer is formed in an upper part of the gate dielectric layer; one part of the metal-containing adjusting layer is formed in the gate dielectric layer, and the other part of the metal-containing adjusting layer is formed in the metal gate electrode layer; or the gate dielectric layer comprises a first gate dielectric layer and a second gate dielectric layer, and the metal-containing adjusting layer is formed between the first gate dielectric layer and the second gate dielectric layer.

In one embodiment, a metal in the metal-containing adjusting layer is at least one metal selected from a group consisting of Er, Y, Gd, and Al.

In one embodiment, a work function of the metal in the metal-containing adjusting layer for a NMOS semiconductor structure is lower than that of a metal in the metal electrode layer; and a work function of the metal in the metal-containing adjusting layer for a PMOS semiconductor structure is higher than that of the metal in the metal electrode layer.

In one embodiment, the metal-containing adjusting layer is formed by implanting a metal ion, or the metal-containing adjusting layer is formed by atomic layer deposition (ALD) or plasma enhanced chemical vapor deposition (PECVD) process.

In one embodiment, an implanting depth of the metal-containing adjusting layer in a transversal direction of the semiconductor structure is same, here the transversal direction is parallel to a channel of the semiconductor structure; an implanting depth of the metal-containing adjusting layer in a part of the semiconductor structure near a source region or near a drain region in the transversal direction of the semiconductor structure is larger than that of the metal-containing adjusting layer in a middle part of the semiconductor structure in the transversal direction thereof; the implanting depth of the metal-containing adjusting layer in a part of the semiconductor structure near the source region or near the drain region in the transversal direction of the semiconductor structure is smaller than that of the metal-containing adjusting layer in the middle part of the semiconductor structure in the transversal direction thereof; the implanting depth of the metal-containing adjusting layer in a part of the semiconductor structure near the source region in the transversal direction of the semiconductor structure is larger than that of the metal-containing adjusting layer in other parts of the semiconductor structure in the transversal direction thereof; or the implanting depth of the metal-containing adjusting layer in a part of the semiconductor structure near the drain region in the transversal direction of the semiconductor structure is larger than that of the metal-containing adjusting layer in other parts of the semiconductor structure in the transversal direction thereof.

In one embodiment, the metal-containing adjusting layer is formed near a source region in a transversal direction of the semiconductor structure; the metal-containing adjusting layer is formed near the source region and in a middle part of the semiconductor structure in the transversal direction thereof; the metal-containing adjusting layer is formed near the source region and a drain region in the transversal direction of the semiconductor structure; or the metal-containing adjusting layer is formed in the middle part of the semiconductor structure in the transversal direction thereof.

According to another embodiment of the present disclosure, a method for forming a semiconductor structure is provided, comprising steps of: providing a substrate; forming a gate dielectric layer by depositing high k dielectric materials on the substrate; forming a metal gate electrode layer by depositing metal gate materials on the gate dielectric layer; forming a metal-containing adjusting layer for adjusting a work function of the semiconductor structure in the gate dielectric layer and/or the metal gate electrode layer; and annealing the semiconductor structure, in which an interfacial layer is formed between the substrate and the gate dielectric layer, and an energy of bond between a metal atom in the metal-containing adjusting layer and an oxygen atom is larger than that between an atom in the gate dielectric layer or in the interfacial layer and an oxygen atom.

In one embodiment, the metal-containing adjusting layer is formed in a lower part of the metal gate electrode layer; the metal-containing adjusting layer is formed in an upper part of the gate dielectric layer; one part of the metal-containing adjusting layer is formed in the gate dielectric layer, and the other part of the metal-containing adjusting layer is formed in the metal gate electrode layer; or the gate dielectric layer comprises a first gate dielectric layer and a second gate dielectric layer, and the metal-containing adjusting layer is formed between the first gate dielectric layer and the second gate dielectric layer.

In one embodiment, a metal in the metal-containing adjusting layer is at least one metal selected from a group consisting of Er, Y, Gd, and Al.

In one embodiment, a work function of the metal in the metal-containing adjusting layer for a NMOS semiconductor structure is lower than that of a metal in the metal electrode layer; and a work function of the metal in the metal-containing adjusting layer for a PMOS semiconductor structure is higher than that of the metal in the metal electrode layer.

In one embodiment, the metal-containing adjusting layer is formed by implanting a metal ion, or the metal-containing adjusting layer is formed by ALD or PECVD.

In one embodiment, an implanting depth of the metal-containing adjusting layer in a transversal direction of the semiconductor structure is same; an implanting depth of the metal-containing adjusting layer in a part of the semiconductor structure near a source region and a drain region in the transversal direction of the semiconductor structure is larger than that of the metal-containing adjusting layer in a middle part of the semiconductor structure in the transversal direction thereof; the implanting depth of the metal-containing adjusting layer in a part of the semiconductor structure near the source region and the drain region in the transversal direction of the semiconductor structure is smaller than that of the metal-containing adjusting layer in the middle part of the semiconductor structure in the transversal direction thereof; the implanting depth of the metal-containing adjusting layer in a part of the semiconductor structure near the source region in the transversal direction of the semiconductor structure is larger than that of the metal-containing adjusting layer in other parts of the semiconductor structure in the transversal direction thereof; or the implanting depth of the metal-containing adjusting layer in a part of the semiconductor structure near the drain region in the transversal direction of the semiconductor structure is larger than that of the metal-containing adjusting layer in other parts of the semiconductor structure in the transversal direction thereof.

In one embodiment, the metal-containing adjusting layer is formed near a source region in a transversal direction of the semiconductor structure; the metal-containing adjusting layer is formed near the source region and in a middle part of the semiconductor structure in the transversal direction thereof; the metal-containing adjusting layer is formed near the source region and a drain region in the transversal direction of the semiconductor structure; or the metal-containing adjusting layer is formed in the middle part of the semiconductor structure in the transversal direction thereof.

According to an embodiment of the present disclosure, the work function of the semiconductor structure may be adjusted by implanting metal ions into the semiconductor structure. Meanwhile, the oxygen atoms in the interfacial layer may also be absorbed in the metal-containing adjusting layer, thus thinning the interface layer, increasing the crystallization temperature of the gate dielectric, decreasing EOT (equivalent oxide thickness), and improving the performance of the semiconductor device.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of the disclosure will become apparent and more readily appreciated from the following descriptions taken in conjunction with the drawings in which.

DETAILED DESCRIPTION

Embodiments of the present disclosure will be described in detail in the following descriptions, examples of which are shown in the accompanying drawings, in which the same or similar elements and elements having same or similar functions are denoted by like reference numerals throughout the descriptions. The embodiments described herein with reference to the accompanying drawings are explanatory and illustrative, which are used to generally understand the present disclosure. The embodiments shall not be construed to limit the present disclosure.

Various embodiments and examples are provided in the following description to implement different structures of the present disclosure. In order to simplify the present disclosure, certain elements and settings will be described. However, these elements and settings are only examples and are not intended to limit the present disclosure. In addition, reference numerals may be repeated in different examples in the disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials may be also applied. Moreover, a structure in which a first feature is "on" a second feature may include an embodiment in which the first feature directly contacts the second feature and may include an embodiment in which an additional feature is prepared between the first feature and the second feature so that the first feature does not directly contact the second feature.

Embodiment 1

Figure 1:
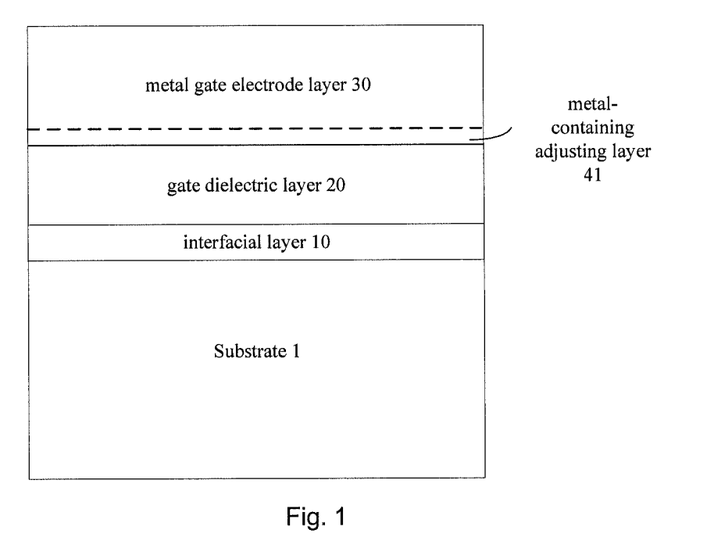
FIG. 1 is a cross-sectional view of a semiconductor structure according to a first embodiment of the present disclosure.

FIG. 1 is a cross-sectional view of a semiconductor structure according to a first embodiment of the present disclosure. The semiconductor structure comprises: a substrate 1; an interfacial layer 10 formed on the substrate 1; a gate dielectric layer 20 formed on the interfacial layer 10; a metal gate electrode layer 30 formed on the gate dielectric layer 20; and a metal-containing adjusting layer 41 formed in a lower part of the metal gate electrode layer 30 for adjusting a work function of the semiconductor structure. In one embodiment, the gate dielectric layer 20 or the metal gate electrode layer 30 may be formed by a conventional technique such as atomic layer deposition (ALD), physical vapor deposition (PVD), or chemical vapor deposition (CVD). As used herein, the term "a lower part of the metal gate electrode layer 30" refers to a part of the metal gate electrode layer 30 near the gate dielectric layer 20. In other words, the metal-containing adjusting layer 41 is completely formed in the metal gate electrode layer 30 and connected with the gate dielectric layer 20. An energy of bond between a metal atom in the metal-containing adjusting layer 41 and an oxygen atom is larger than that between an atom of materials forming the gate dielectric layer 20 or the interfacial layer 10 and an oxygen atom. For example, the metal atom may be Er, Y, Gd, or Al. In this way, because the energy of bond between the metal atom in the metal-containing adjusting layer 41 and the oxygen atom is larger than that between the atom of materials forming the gate dielectric layer 20 and the oxygen atom and the energy of bond between the atom of materials forming the gate dielectric layer 20 and the oxygen atom is larger than that between the atom of materials forming the interfacial layer 10, the oxygen atoms may be transferred from the interfacial layer 10 to the gate dielectric layer 20, and the oxygen atoms in the gate dielectric layer 20 may be transferred to the metal-containing adjusting layer 41 to form an oxide with an implanted ion, thus thinning the interfacial layer 10 and decreasing an EOT (equivalent oxide thickness).

In one embodiment, the gate dielectric layer 20 or the metal gate electrode layer 30 may be formed by a conventional technique such as atomic layer deposition (ALD), physical vapor deposition (PVD), or chemical vapor deposition (CVD), and the metal-containing adjusting layer 41 may be formed by a technique similar to that for forming the gate dielectric layer 20 or the metal gate electrode layer 30 or the metal-containing adjusting layer 41 may be formed by ion implanting. An accurate control on a transversal position and a thickness of the metal-containing adjusting layer may be achieved by disposing an ion implantation mask, oblique implantation, and photolithography, thus adjusting the thickness and the position of the metal-containing adjusting layer according to a requirement of the semiconductor structure. The detailed description thereof is omitted here for brevity.

It should be noted that, the thickness of the metal-containing adjusting layer 41 may be set that the oxygen atoms in the interfacial layer may be adsorbed in the metal gate electrode layer partially or completely. Moreover, after the oxygen atoms are absorbed, dielectric constants of metal oxides and/or metal oxygen nitrides corresponding to metals (such as Er, Y, or Gd) and/or metal nitrides (such as AlN) are greater than that of the materials forming the interface layer.

In the following embodiments, the present disclosure will be described by taking ion implantation as an example; however, it would be appreciated by those skilled in the art that the metal-containing adjusting layer 41 is preferably formed by ALD.

In this embodiment, metal ions may be implanted into the metal gate electrode layer 30 by the cathode vacuum arc ion implantation process.

It would be appreciated that at least one metal ion selected from a group consisting of Er, Y, Gd, and Al may be implanted into the metal gate electrode layer 30 so as to form at least one metal-containing adjusting layer 41.

In addition, because the requirements of NMOS and PMOS for the work function are different, the work function of the metal ion implanted into a NMOS semiconductor structure may be different from that of the metal ion implanted into a PMOS semiconductor structure. Particularly, in this embodiment, the metal ion implanted into the NMOS semiconductor structure may be a metal with low work function, such as at least one metal selected from lanthanide metals, thus meeting the requirement of NMOS for the work function.

Embodiment 2

Figure 2:
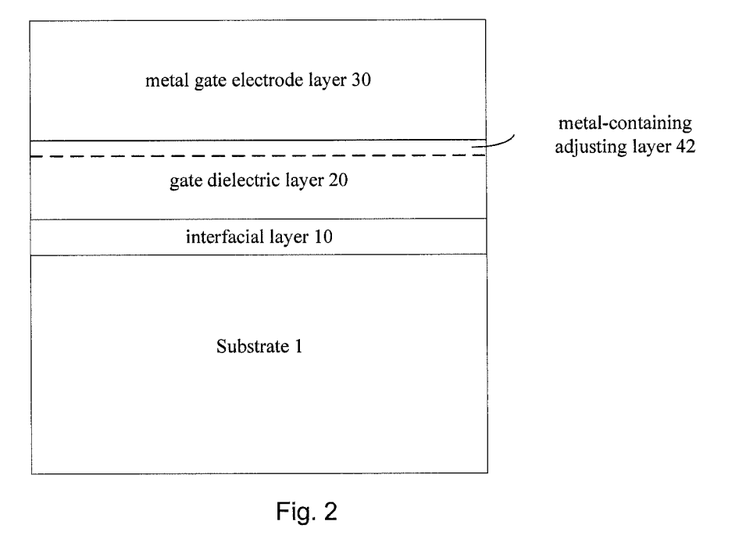
FIG. 2 is a cross-sectional view of a semiconductor structure according to a second embodiment of the present disclosure.

FIG. 2 is a cross-sectional view of a semiconductor structure according to a second embodiment of the present disclosure. The semiconductor structure comprises: a substrate 1; an interfacial layer 10 formed on the substrate 1; a gate dielectric layer 20 formed on the interfacial layer 10; a metal gate electrode layer 30 formed on the gate dielectric layer 20; and a metal-containing adjusting layer 42. In this embodiment, the metal-containing adjusting layer 42 is similar to the metal-containing adjusting layer 41 in Embodiment 1, except that the metal-containing adjusting layer 42 is formed in an upper part of the gate dielectric layer 20. As used herein, the term "an upper part of the gate dielectric layer 20" refers to a part of the gate dielectric layer 20 near the metal gate electrode layer 30. In other words, the metal-containing adjusting layer 42 is completely formed in the gate dielectric layer 20 and connected with the metal gate electrode layer 30.

Embodiment 3

Figure 3:
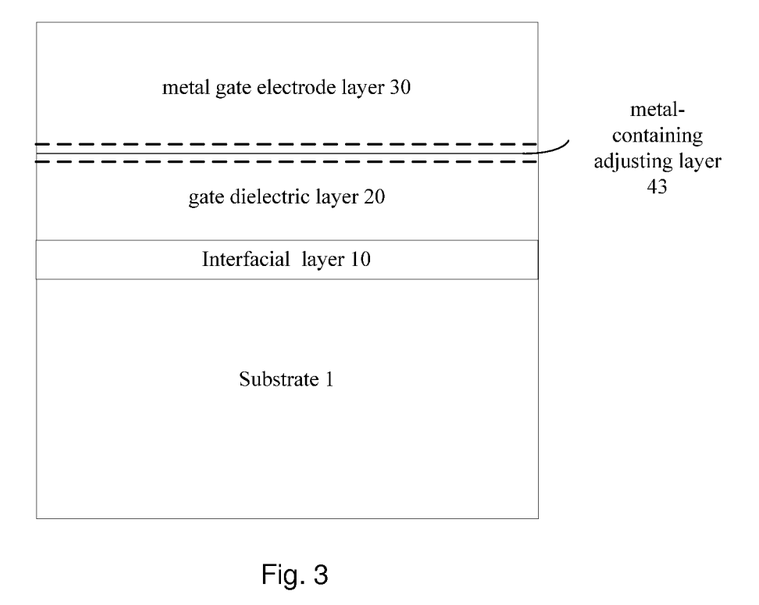
FIG. 3 is a cross-sectional view of a semiconductor structure according to a third embodiment of the present disclosure.

FIG. 3 is a cross-sectional view of a semiconductor structure according to a third embodiment of the present disclosure. The semiconductor structure comprises: a substrate 1; an interfacial layer 10 formed on the substrate 1; a gate dielectric layer 20 formed on the interfacial layer 10; a metal gate electrode layer 30 formed on the gate dielectric layer 20;

and a metal-containing adjusting layer 43. In this embodiment, the metal-containing adjusting layer 43 is similar to the metal-containing adjusting layer 41 in Embodiment 1, except that one part of the metal-containing adjusting layer 43 is formed in the metal gate electrode layer 30 and the other part of the metal-containing adjusting layer 43 is formed in the gate dielectric layer 20.

Embodiment 4

Figure 4:
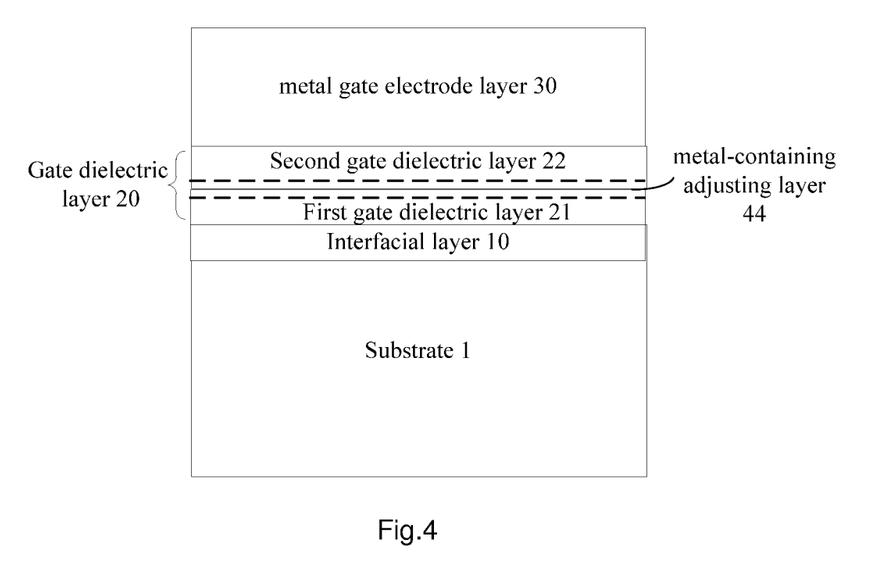
FIG. 4 is a cross-sectional view of a semiconductor structure according to a fourth embodiment of the present disclosure.

FIG. 4 is a cross-sectional view of a semiconductor structure according to a fourth embodiment of the present disclosure. The semiconductor structure comprises: a substrate 1; an interfacial layer 10 formed on the substrate 1; a gate dielectric layer formed on the interfacial layer 10, in which the gate dielectric layer comprises a first gate dielectric layer 21 and a second gate dielectric layer 22, and a metal-containing adjusting layer 44 is formed between the first gate dielectric layer 21 and the second gate dielectric layer 22; a metal gate electrode layer 30 formed on the second gate dielectric layer 22.

It should be noted that, an implantation depth of the metal ions in a transversal direction of the semiconductor structure may be same or different. The equivalent oxide thickness may be changed by changing the implantation depth, thus modifying a control ability of the semiconductor structure to a channel region of a MOSFET device.

FIGS. 5-8 are diagrams showing different implantation depths of a metal ion in a transversal direction of a semiconductor structure according to an embodiment of the present disclosure. It should be noted that in FIGS. 5-8, the metal-containing adjusting layer may be formed in at least one layer selected from a group consisting of the interfacial layer 10, the gate dielectric layer 20, and the metal gate electrode layer 30.

Figure 5:
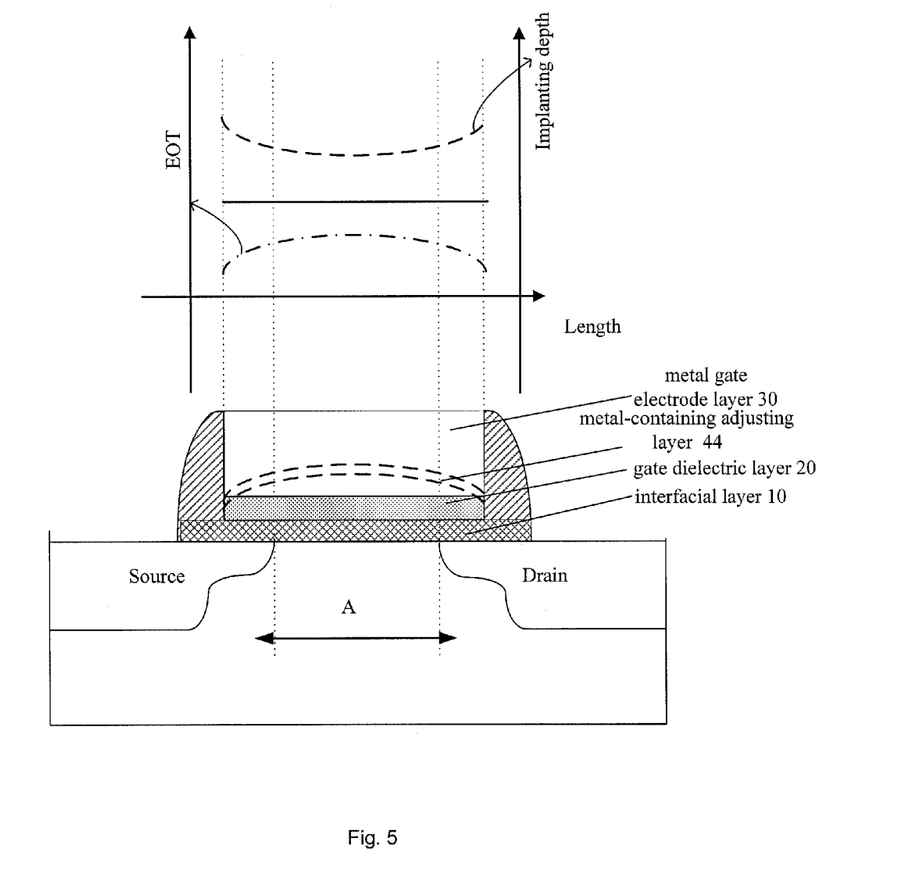
FIGS. 5-8 are diagrams showing different implanting depth of a metal ion in a transversal direction of a semiconductor structure according to an embodiment of the present disclosure.

As shown in FIG. 5, an implantation depth of a metal-containing adjusting layer 44 in two ends of the semiconductor structure in a transversal direction A (a direction shown by an arrow in FIG. 5) thereof is larger than that of the metal-containing adjusting layer 44 in a middle part of the semiconductor structure in the transversal direction thereof. In this way, a middle part of the interfacial layer 10 is thicker than two ends thereof, thus changing a transversal gate capacitance. Particularly, in this embodiment, a control ability of the semiconductor structure to a channel region may be weakened due to the relative small EOT near the source and drain region, and an influence of the gate on the source and the drain region may be reduced, thus alleviating a drain induced barrier lowering (DIBL) effect and reducing leakage.

Figure 6:
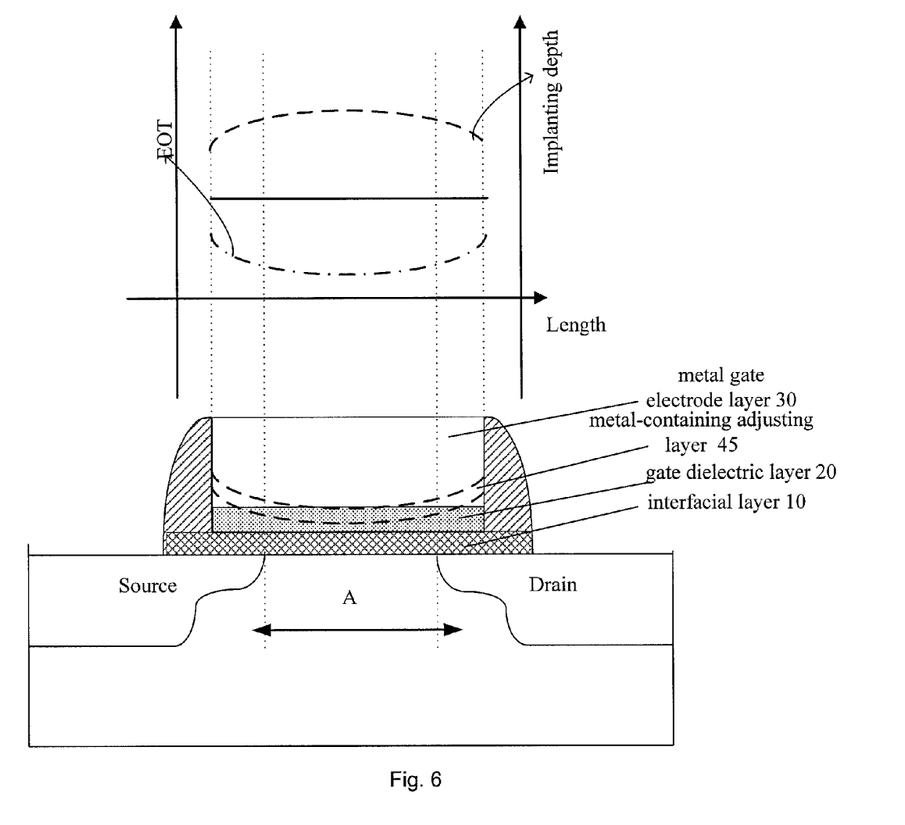

As shown in FIG. 6, an implantation depth of a metal-containing adjusting layer 45 in a middle part of the semiconductor structure in a transversal direction A (a direction shown by an arrow in FIG. 6) thereof is larger than that of the metal-containing adjusting layer 45 in two ends of the semiconductor structure in the transversal direction thereof. In this way, the middle part of the interfacial layer 10 is thinner than two ends thereof, thus changing a transversal gate capacitance.

The implantation depth of the ions in the middle part of the semiconductor structure in the transversal direction is larger than that of the metal-containing adjusting layer 45 in two ends of the semiconductor structure near a source region and a drain region in the transversal direction thereof. Therefore, a control ability of the semiconductor structure to a channel region may be strengthened. When a gate voltage is applied, carrier injection or tunneling may be easily achieved in the part of the gate structure near the source region and the drain region, which may be used as a method for achieving multi-bit storage in memory device applications.

Figure 7:
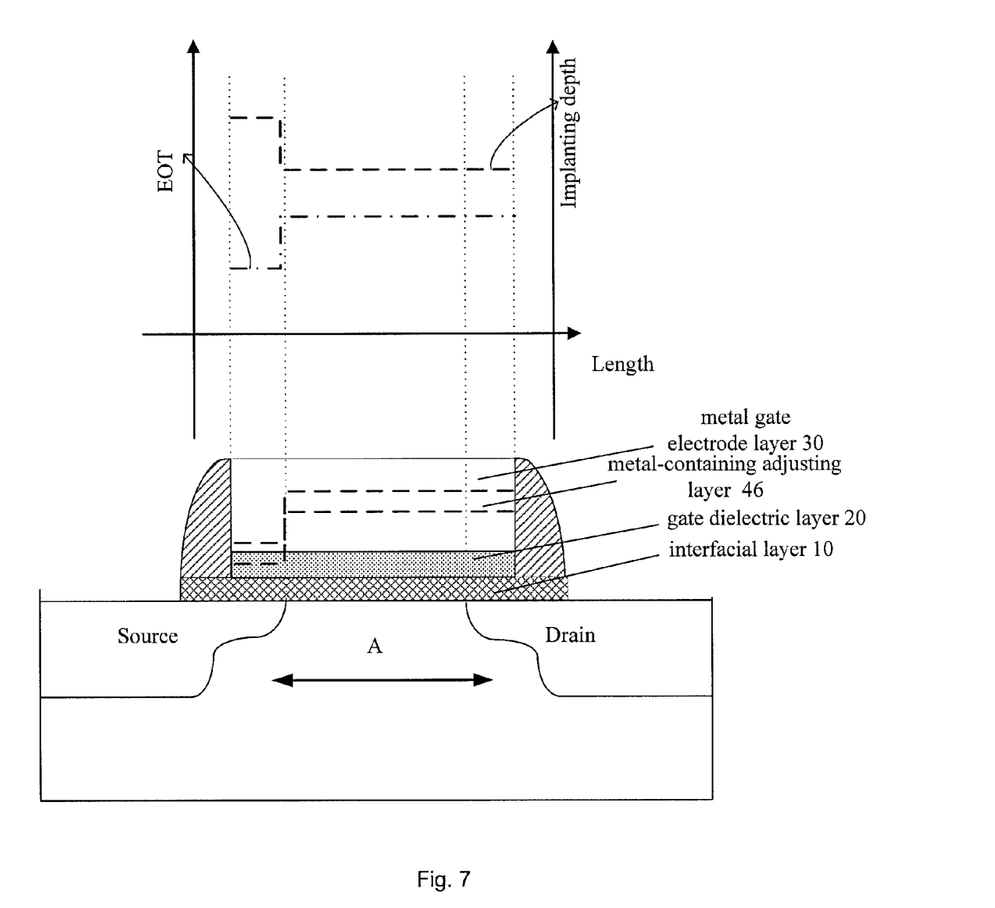

As shown in FIG. 7, an implantation depth of a metal-containing adjusting layer 46 in a part of the semiconductor device near a source in a transversal direction A (direction shown by an arrow in FIG. 7) thereof is larger than that of the metal-containing adjusting layer 46 in other parts of the semiconductor structure in the transversal direction thereof. In this way, a part of the interfacial layer 10 near the source is thinned down more, thus changing a transversal gate capacitance. In this embodiment, a control ability of the semiconductor structure to a channel may be strengthened. For a tunneling field effect transistor, a tunneling probability of a carrier in a channel near the source region may be increased, thus increasing a drive current.

Figure 8:
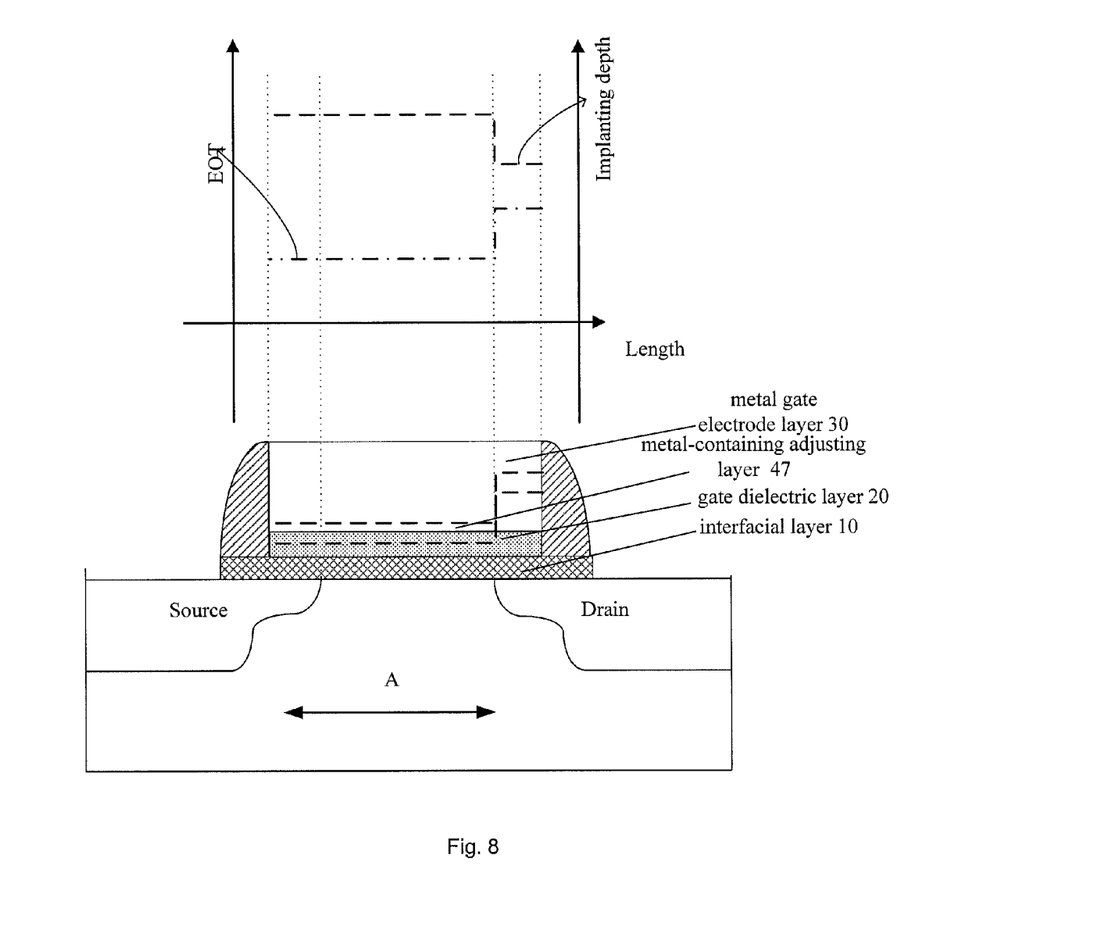

As shown in FIG. 8, an implantation depth of a metal-containing adjusting layer 47 in a part of the semiconductor structure near a drain region in a transversal direction A (a direction shown by an arrow in FIG. 8) thereof is smaller than that of the metal-containing adjusting layer 47 in other parts of the semiconductor structure in the transversal direction thereof. In this way, a control ability of the semiconductor structure near the drain region to a channel may be weakened, thus alleviating a drain induced barrier lowering (DIBL) effect and reducing leakage.

Figure 9:
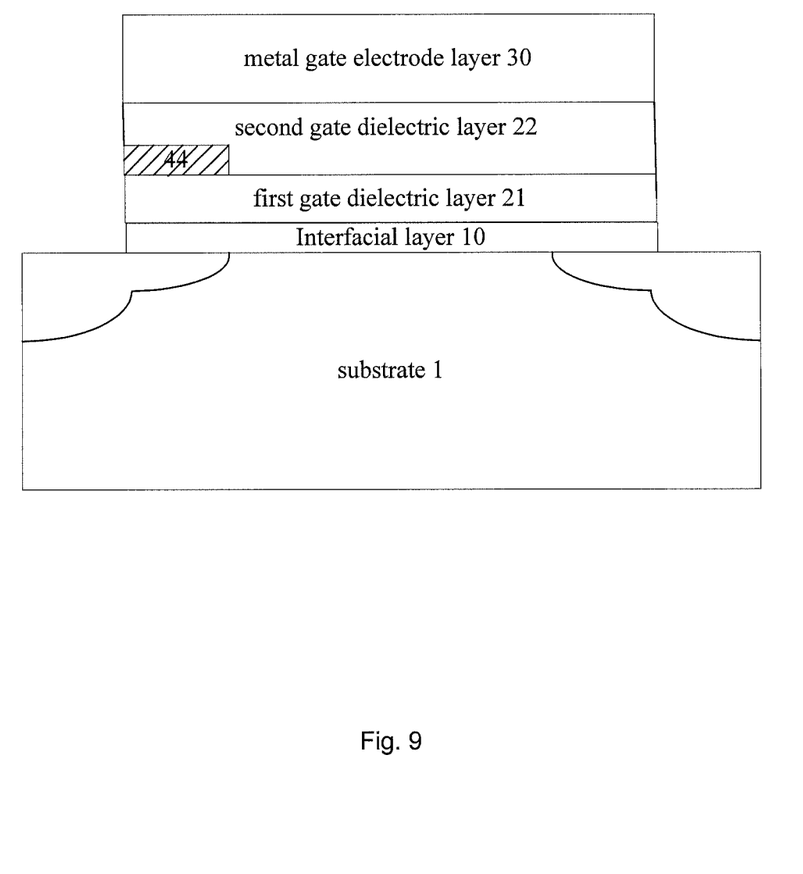
FIGS. 9-12 are cross-sectional views of different semiconductor structures with a metal-containing adjusting layer formed in different parts.
Figure 10:
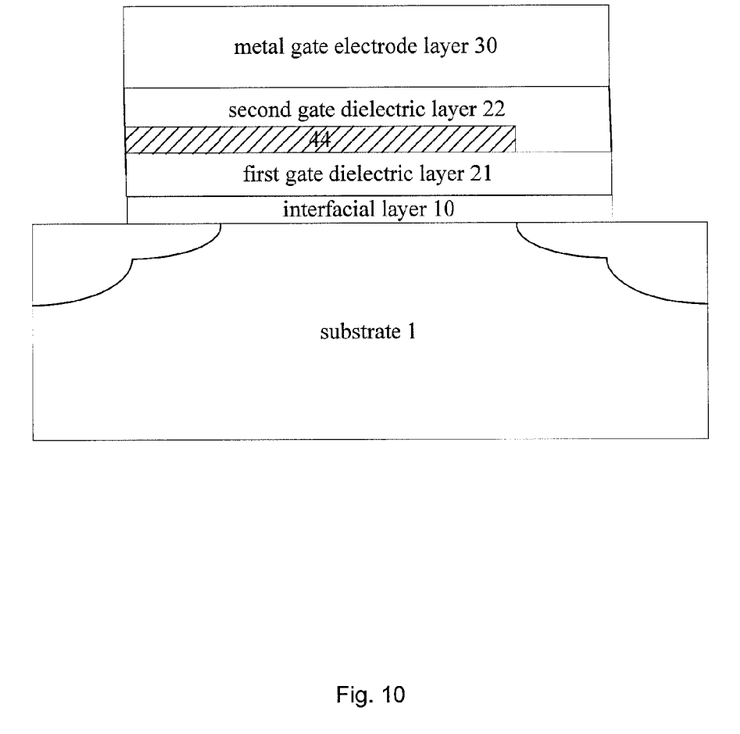
Figure 11:
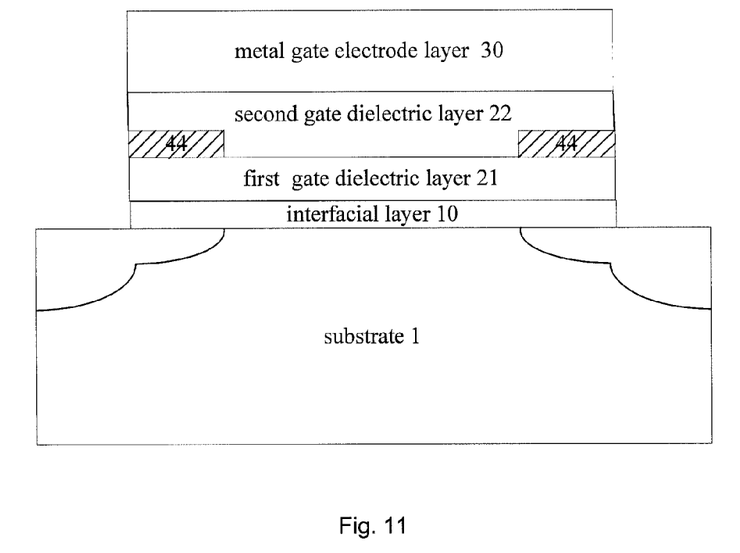
Figure 12:
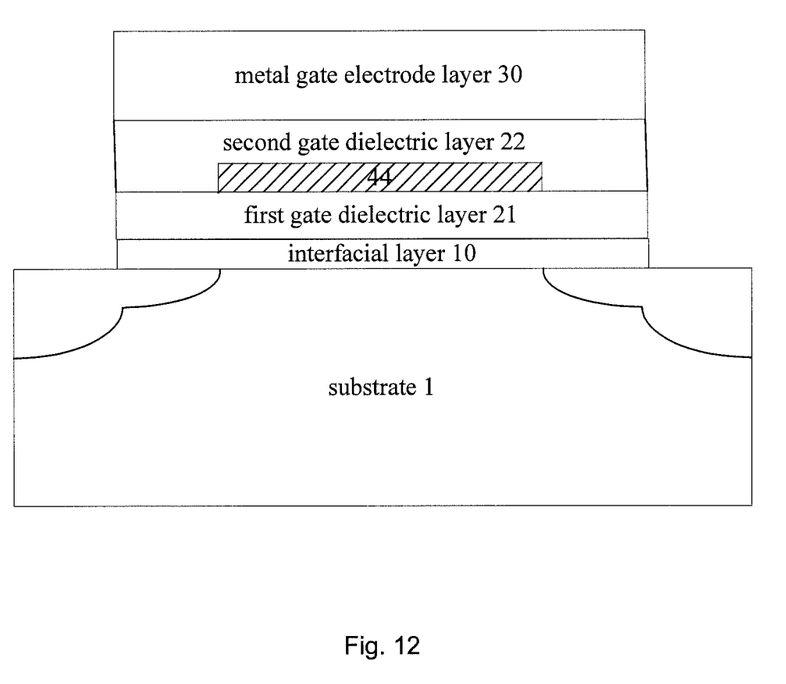

FIG. 9 is a cross-sectional view of a semiconductor structure with a metal-containing adjusting layer formed in a part of a second gate dielectric layer 22 near a source region or a drain region. As shown in FIG. 9, a metal-containing adjusting layer is formed in a part of the semiconductor structure near a source region in a transversal direction of the semiconductor structure. Certainly, in other embodiments, the metal-containing adjusting layer may be only formed in a part of the semiconductor structure near a drain region in the transversal direction, or the metal-containing adjusting layer may also be formed in a middle part and a part of the semiconductor structure near a source, but may not be formed in a part of the semiconductor structure near the drain, as shown in FIG. 10. As shown in FIG. 11, the metal-containing adjusting layer is formed in a part of the semiconductor structure near a source region and a drain region in a transversal direction of the semiconductor structure. As shown in FIG. 12, the metal-containing adjusting layer 44 is formed in a middle part of the semiconductor structure in a transversal direction of the semiconductor structure but is not formed in a part of the semiconductor structure near a source region and a drain region in the transversal direction.

It would be appreciated that the above embodiments shown in FIGS. 1-12 are merely illustrative but are not intended to limit the scope of the present disclosure. The implantation depth of metal ions may be adjusted according to practical requirements, which should fall within the scope of the present disclosure.

Figure 13:
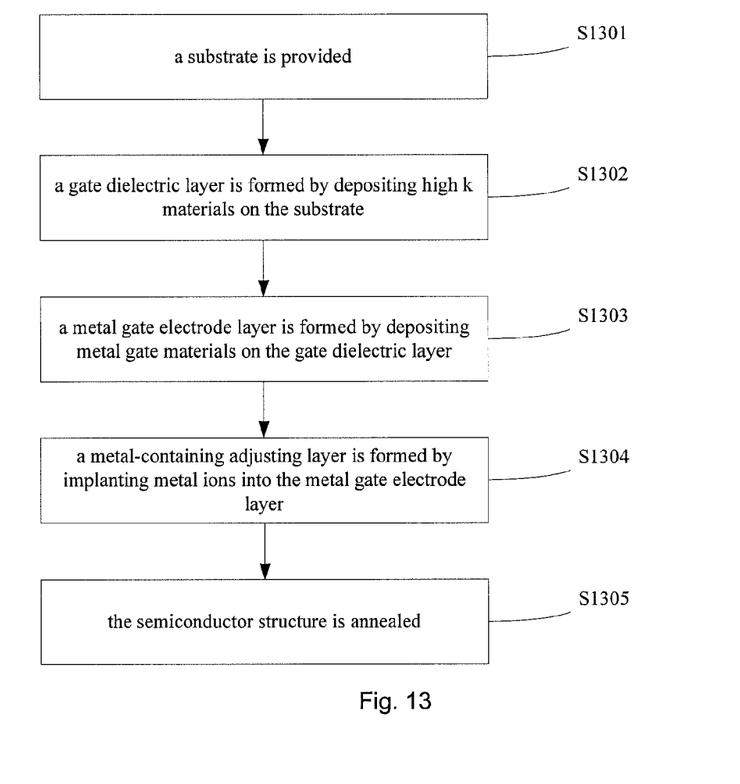
FIG. 13 is a flow chart showing a method for forming a semiconductor structure according to an embodiment of the present disclosure.

In order to achieve the above embodiments, a method for forming a semiconductor structure may also be provided. FIG. 13 is a flow chart showing a method for forming a semiconductor structure according to an embodiment of the present disclosure. The method comprises the following steps.

Step S1301, a substrate is provided.

Step S1302, a gate dielectric layer is formed by depositing high k dielectric materials on the substrate. An interfacial layer is formed between the substrate and the gate dielectric layer.

Step S1303, a metal gate electrode layer is formed by depositing metal gate materials on the gate dielectric layer.

Steps S1301 to S1303 may be achieved through conventional technologies. The detailed description thereof is omitted here for brevity.

Step S1304, a metal-containing adjusting layer is formed by implanting metal ions into the metal gate electrode layer. Certainly, in other embodiments, the metal-containing adjusting layer may be also formed by ALD.

Particularly, metal ions may be implanted into the metal gate electrode layer by the cathode vacuum arc ion implantation to form the metal-containing adjusting layer.

An energy of bond between a metal atom in the metal-containing adjusting layer and an oxygen atom is larger than that between an atom of materials forming the gate dielectric layer or the interfacial layer and an oxygen atom. For example, the metal atom may be Er, Y, Gd, or Al. In addition, at least one metal ion may be implanted to form at least one metal-containing adjusting layer in the semiconductor structure.

Step S1305, the semiconductor structure is annealed.

Moreover, it would be appreciated that, if a position of the implanted metal ions is different, the work function and the equivalent oxide thickness (EOT) will be different. For example, in one embodiment, the metal-containing adjusting layer is formed in a lower part of the metal gate electrode layer. In another embodiment, the metal-containing adjusting layer is formed in an upper part of the gate dielectric layer. In yet another embodiment, one part of the metal-containing adjusting layer is formed in the metal gate electrode layer, and the other part of the metal-containing adjusting layer is formed in the gate dielectric layer.

Figure 14:
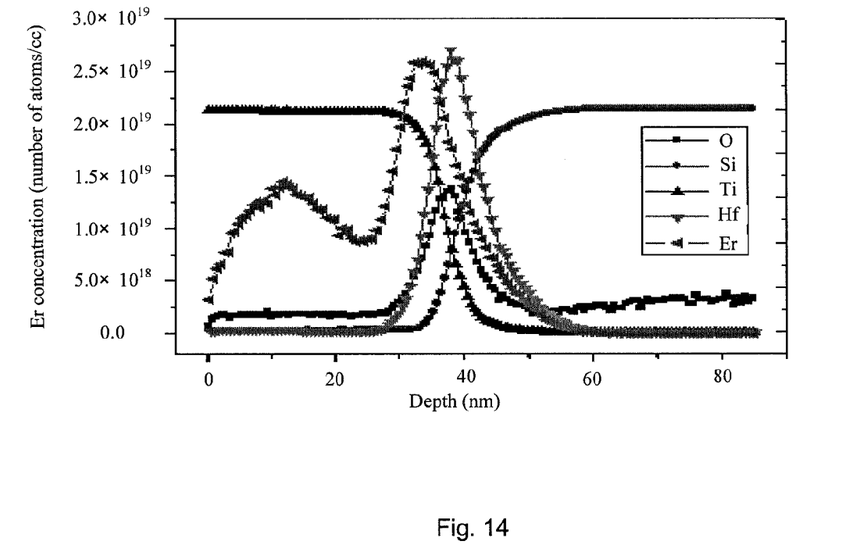
FIG. 14 is an atom distribution diagram in a semiconductor structure showing a state after an Er ion is implanted and then annealed.

FIG. 14 is an atom distribution diagram in a semiconductor structure showing a state after an Er ion is implanted and then annealed. As shown in FIG. 14, the Er ions have been implanted into the gate dielectric layer.

Figure 15:
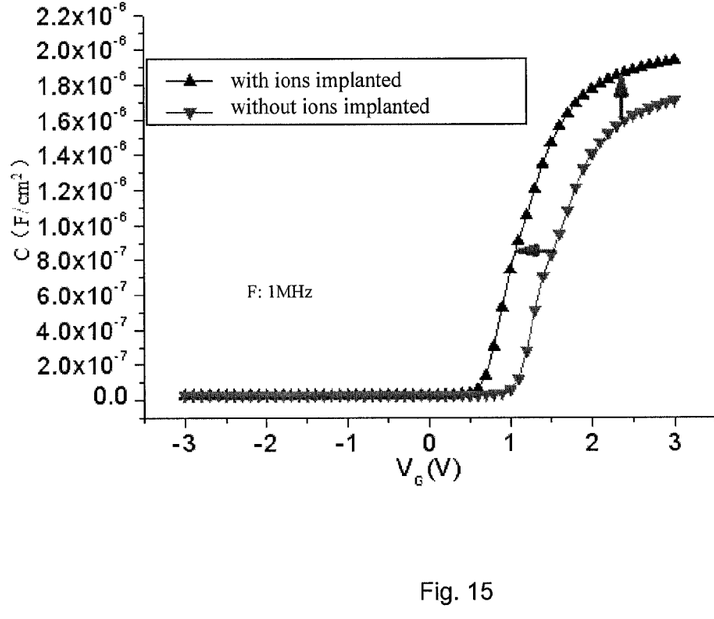
FIG. 15 is a capacitance-voltage curve of a semiconductor structure with and without an Er ion implantation.

FIG. 15 is a capacitance-voltage curve of a semiconductor structure with and without an Er ion atom implanting. As shown in FIG. 15, the capacitance of the semiconductor structure with Er ion implantation is larger than that of the reference semiconductor structure without Er ion implantation. This suggests that the EOT is decreased for the semiconductor structure with Er ion implantation. In addition, the flat band voltage of the semiconductor structure is shifted to negative direction, which is useful to adjust the work function of the semiconductor structure to meet a requirement of NMOS.

Moreover, for different devices, the implanted ions may be different. For example, for NMOS and PMOS, implanted ions with different work functions may be selected. Generally, a work function of the metal ion in the metal-containing adjusting layer for a NMOS semiconductor structure is lower than that of a metal ion in the metal electrode layer; and a work function of the metal ion in the metal-containing adjusting layer for a PMOS semiconductor structure is higher than that of the metal ion in the metal electrode layer. Particularly, in one embodiment, lanthanide metal ions are implanted into the NMOS semiconductor structure.

In addition, an implantation depth of metal ions in the transversal direction of the semiconductor structure may also be different, as shown in FIGS. 5-8. In one embodiment, different implantation depths may be achieved by oblique implantation or using an implantation hard mask with different thicknesses. The detailed description thereof is omitted here for brevity.

Figure 16:
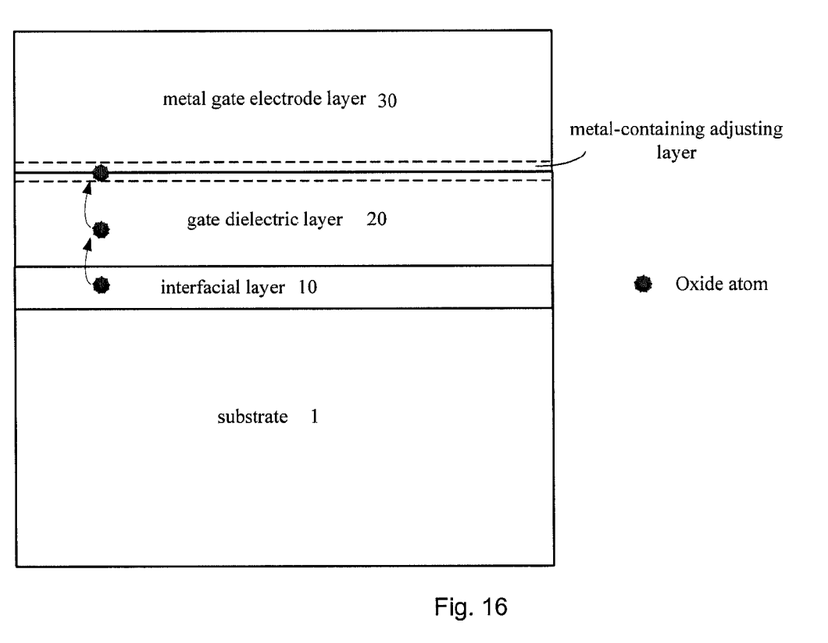
FIG. 16 is a schematic showing that an oxygen atom is adsorbed by a metal-containing adjusting layer when a semiconductor structure is annealed.

FIG. 16 is a schematic showing that an oxygen atom is adsorbed remotely during a semiconductor structure is annealed. Because the energy of bond between the metal atom in the metal-containing adjusting layer and the oxygen atom is larger than that between the atom of materials forming the gate dielectric layer and the oxygen atom and the energy of bond between the atom of materials forming the gate dielectric layer and the oxygen atom is larger than that between the atom of materials forming the interfacial layer and the oxygen atom, the oxygen atoms may be transferred from the interfacial layer to the gate dielectric layer, and the oxygen atoms in the gate dielectric layer may be transferred to the metal-containing adjusting layer to form an oxide of an implanted ion, thus thinning down the $SiO_x$ interfacial layer significantly. In one embodiment, the semiconductor structure comprises a 34 nm-thick TiN/5 nm-thick $HfO_2$/1 nm-thick $SiO_x$ interfacial layer /Si substrate, the Er atom is implanted into the TiN layer and then annealed at 1000° C. for 30 seconds in $N_2$ atmosphere. After these processing, the thickness of $SiO_x$ interfacial layer is reduced to about 0.6 nm. If the same semiconductor structure without Er atom implantation experiences the same annealing, the thickness of $SiO_x$ interfacial layer is increased to about 2.2 nm. In order to explain the thickness of the $SiO_x$ layer reduction, the Gibbs free energy change may be introduced. The Gibbs free energy change ($\Delta G_{1000}^0$) at 1000K has a large positive value when the reaction given by: $Si+MO_x=M+SiO_x$ is satisfied.

In this situation, the material M represents the Hf and Er atom. The ($\Delta G_{1000}^0$ (0<47.468(Hf)<122.030(Er))) represents the ability that the material atomic bonding with the oxygen atom is strong or weak. The ($\Delta G_{1000}^0$ of Er atom is much larger than that of Hf atom. Therefore, during thermal annealing, the oxygen atoms move from the $SiO_x$ layer to the $HfO_2$ layer and then migrate to the upper region of the $HfO_2$ layer and bottom region of TiN layer containing implanted Er atoms where they react with the Er atoms. The oxidation of Er atom may be a driving force of the reaction, and the oxygen vacancies (Vo) in $HfO_2$ act as media for a cascade reaction of oxygen transfer from the SiO layer to the Er atoms.

Figure 17A:
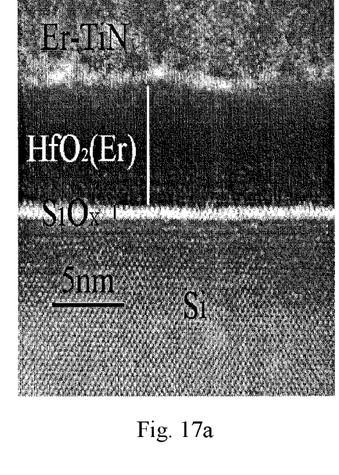
FIG. 17a is a cross-sectional transmission electron microscopy image of an annealed semiconductor structure with an Er ion implantation.
Figure 17B:
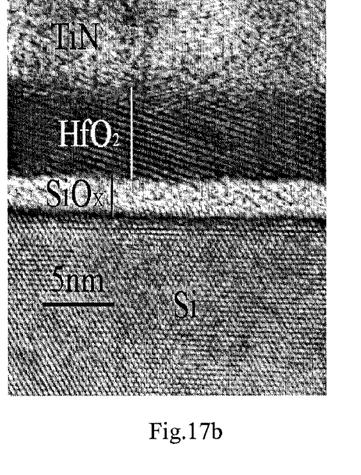
FIG. 17b is a cross-sectional transmission electron microscopy image of an annealed semiconductor structure without an Er ion implantation.

The metal-containing adjusting layer may not only adjust the work function of the semiconductor structure and decrease EOT, but also may increase the crystallization temperature of a gate dielectric, as shown in FIG. 17a and FIG. 17b. FIG. 17a is a cross-sectional transmission electron microscopy image of an annealed semiconductor structure with an Er ion atom implantation. FIG. 17b is a cross-sectional transmission electron microscopy image of an annealed semiconductor structure without an Er ion atom implantation. As shown in FIG. 17a and FIG. 17b, after the semiconductor structure is annealed at 1000° C., the dielectric layer with Er ion implanting still remains amorphous, and the dielectric layer without Er ion implanting becomes crystalline, so that the crystallization temperature of the dielectric layer may be increased after Er ion implantation. Moreover, it may be seen from FIG. 17a and FIG. 17b that the interfacial layer is significantly reduced.

Figure 18:
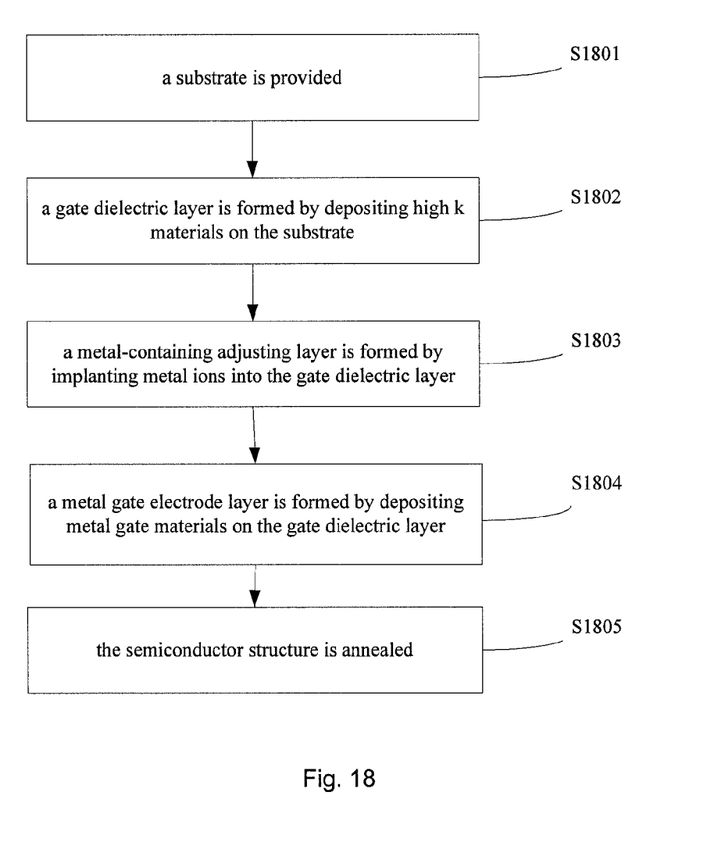
FIG. 18 is a flow chart showing a method for forming a semiconductor structure according to another embodiment of the present disclosure.

In order to achieve the above embodiments, another method for forming a semiconductor structure is also provided. FIG. 18 is a flow chart showing a method for forming a semiconductor structure according to another embodiment of the present disclosure. The method comprises the following steps.

Step S1801, a substrate is provided.

Step S1802, a gate dielectric layer is formed by depositing high k dielectric materials on the substrate.

Step S1803, a metal-containing adjusting layer is formed by implanting metal ions into the gate dielectric layer.

In one embodiment, the metal-containing adjusting layer is formed in an upper part of the gate dielectric layer.

Step S1804, a metal gate electrode layer is formed by depositing metal gate materials on the gate dielectric layer.

Step S1805, the semiconductor structure is annealed.

The method shown in FIG. 18 may be substantially the same as that shown in FIG. 13, except that the metal ions are implanted into the gate dielectric layer before the metal gate electrode layer is formed.

According to an embodiment of the present disclosure, the work function of the semiconductor structure may be adjusted by implanting metal ions into the semiconductor structure. Meanwhile, the oxygen atoms in the interfacial layer may also be absorbed in the metal-containing adjusting layer, thus thinning the interface layer, increasing the crystallization temperature of the gate dielectric, decreasing EOT (equivalent oxide thickness), and improving the performance of the semiconductor device.

Although explanatory embodiments have been shown and described, it would be appreciated by those skilled in the art that changes, alternatives, and modifications all falling into the scope of the claims and their equivalents may be made in the embodiments without departing from spirit and principles of the disclosure.

What is claimed is:

1. A semiconductor structure with work function adjustment metal layer, comprising:
    a substrate;
    a gate dielectric layer formed on the substrate;
    a metal gate electrode layer formed on the gate dielectric layer; and
    at least one metal-containing adjusting layer for adjusting a work function of part of the semiconductor structure, wherein:
    one part of the metal-containing adjusting layer is formed in the gate dielectric layer, and the remaining part of the metal-containing adjusting layer is formed in the metal gate electrode layer;
    an interfacial layer is formed between the substrate and the gate dielectric layer, and first energy of a bond between a metal atom in the metal-containing adjusting layer and an oxygen atom is larger than second energy of a bond between an atom in the gate dielectric layer and an oxygen atom or third energy of a bond between an atom in the interfacial layer and an oxygen atom;
    the metal-containing adjusting layer is formed by implanting a metal ion, or the metal-containing adjusting layer is formed by atomic layer deposition, plasma enhanced chemical vapor deposition, or sputtering process; and
    an implantation depth of the metal-containing adjusting layer in a part of the semiconductor structure near a source and near a drain in the transversal direction of the semiconductor structure is larger than an implantation depth of the metal-containing adjusting layer in a middle part of the semiconductor structure in the transversal direction thereof.

2. The semiconductor structure according to claim 1, wherein a metal in the metal-containing adjusting layer is at least one metal selected from a group consisting of Er, Y, Gd, and Al.

3. The semiconductor structure according to claim 1, wherein
    a work function of the metal in the metal-containing adjusting layer for a NMOS semiconductor structure is lower than that of a metal in the metal gate electrode layer; and
    a work function of the metal in the metal-containing adjusting layer for a PMOS semiconductor structure is higher than that of the metal in the metal gate electrode layer.

4. The semiconductor structure according to claim 1, wherein:
    the metal-containing adjusting layer is formed near a source region in a transversal direction of the semiconductor structure.

5. The semiconductor structure according to claim 1, wherein:
    the metal-containing adjusting layer is formed near a source region and a drain region in the transversal direction of the semiconductor structure.

* * * * *